United States Patent
Ieong et al.

(10) Patent No.: US 7,983,379 B2
(45) Date of Patent: Jul. 19, 2011

(54) SHIFT REGISTER AND LIQUID CRYSTAL DISPLAY USING SAME

(75) Inventors: Man-Fai Ieong, Miao-Li (TW); Sz-Hsiao Chen, Miao-Li (TW)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 844 days.

(21) Appl. No.: 12/004,588

(22) Filed: Dec. 24, 2007

(65) Prior Publication Data

US 2008/0150875 A1 Jun. 26, 2008

(30) Foreign Application Priority Data

Dec. 22, 2006 (CN) .......................... 2006 1 0157860

(51) Int. Cl.
*G11C 19/00* (2006.01)

(52) U.S. Cl. .................. 377/64; 377/68; 377/78; 377/79

(58) Field of Classification Search ........................ None
See application file for complete search history.

(56) References Cited

U.S. PATENT DOCUMENTS

| | | | | |
|---|---|---|---|---|
| 6,970,530 | B1 * | 11/2005 | Wang et al. | 377/69 |
| 7,027,550 | B2 | 4/2006 | Lin | |
| 7,369,111 | B2 * | 5/2008 | Jeon et al. | 345/100 |
| 7,436,923 | B2 * | 10/2008 | Tobita | 377/64 |
| 7,612,770 | B2 * | 11/2009 | Lee | 345/204 |
| 7,688,933 | B2 * | 3/2010 | Morosawa | 377/64 |
| 7,738,623 | B2 * | 6/2010 | Tobita | 377/64 |
| 2005/0008114 | A1 | 1/2005 | Moon | |

FOREIGN PATENT DOCUMENTS

CN 1588555 A 3/2005

* cited by examiner

*Primary Examiner* — Tuan Lam
(74) *Attorney, Agent, or Firm* — Wei Te Chung

(57) ABSTRACT

An exemplary shift register (20) includes a plurality of shift register units (200). The shift register units receive a clock signal and an inverse clock signal and output a plurality of shift register signals in sequence. The outputs waveforms of pre-stage shift register unit and the rear-stage shift register unit have no overlapping signals.

8 Claims, 4 Drawing Sheets

US 7,983,379 B2

SHIFT REGISTER AND LIQUID CRYSTAL DISPLAY USING SAME

CROSS-REFERENCE TO RELATED APPLICATION

This application is related to, and claims the benefit of, a foreign priority application filed in China as Application No. 200810067935.6 on Jun. 20, 2008. The related application is incorporated herein by reference.

FIELD OF THE INVENTION

This invention relates to shift registers, and more particularly to a shift register typically used in a driving circuit of a liquid crystal display without overlapping shift register signals.

GENERAL BACKGROUND

Shift registers are core circuit units of integrated circuits that are used in thin film transistor liquid crystal displays (TFT-LCDs). A shift register provides sequential pulse signals to scanning lines of a TFT LCD, so as to control on or off states of TFTs connected to the scanning lines.

Referring to FIG. 5, this is a circuit diagram of a shift register unit 100 of a typical shifter register. The shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives an output signal as a start signal VS from the pre-stage shift register unit (not shown), with the detailed circuit of the first clock inversion circuit 110 described in the following.

The first clock inversion circuit 110 includes a first transistor M1, a second transistor M2, a third transistor M3, a fourth transistor M4, a first output VO1, and a second output VO2. The first transistor M1 includes a gate for receiving the start signal VS, a source coupled to a first voltage (VDD), such as a power voltage, and a drain coupled to a source of the second transistor M2. The second transistor M2 includes a gate and a drain both coupled to a second voltage (VSS), such as a grounding voltage. The third transistor M3 includes a source coupled to the source of the second transistor M2, a drain serving as a first output, and a gate coupled to a gate of the fourth transistor M4. The gates of the third and fourth transistors M3 and M4 serve as a control terminal to receive a clock signal $\overline{TS}$. The fourth transistor M4 includes a source coupled to a start signal VS, and a drain serving as a second output.

The inverter 120 includes a fifth transistor M5 and a sixth transistor M6. The inverter 120 outputs an output signal that serves as the shift register signal VO. The fifth transistor M5 includes a source coupled to the first voltage VDD, a gate coupled to the drain of the third transistor M3, and a drain coupled to a source of the sixth transistor M6. The drain of the fifth transistor M5 and the source of the sixth transistor M6 serve as an output for outputting the shift register signal VO. The sixth transistor M6 further includes a gate coupled to the drain of the fourth transistor M4, and a drain coupled to the second voltage VSS.

The second clock inversion circuit 130 and the first clock inversion circuit 120 have the similar structure. The second clock inversion circuit 130 includes a seventh transistor M7, an eighth transistor M8, a ninth transistor M9, and a tenth transistor M10. The seventh transistor M7 includes a gate for receiving the output signal VO from the inverter 12, a source coupled to the first voltage VDD, and a drain coupled to the a source of the PMOS transistor M8. The eighth transistor M8 further includes a gate and a drain coupled to the second voltage VSS. The ninth transistor M9 includes a source coupled to the source of the eighth transistor M8, a gate coupled to a gate of the tenth transistor M10, and a drain coupled to the gate of the fifth transistor M5. The gates of the ninth and tenth transistors M9 and M10 serve as a control terminal for receiving an inverse clock signal TS. The tenth transistor M10 further includes a source coupled to the gate of the seventh transistor M7 and the shift register signal VO of the inverter 120, and a drain coupled to the gate of the sixth transistor M6 for serving as a second output.

Referring to FIG. 6, this is a sequence waveform diagram of pulse signals of the shift register unit 100. During period t1, the third and fourth transistors M3 and M4 are switched off and the ninth and tenth transistors M9 and M10 are switched on because the start signal VS jumps to a low voltage and the clock signal $\overline{TS}$ jumps to a high voltage. Thus, the inverter 120 and the second clock inversion circuit 130 perform latch operation. The sixth transistor M6 is switched off such that the shift register signal VO of the inverter 120 keeps an original state of the previous stage.

During period t2, the third and fourth transistors M3 and M4 are switched on and the ninth and tenth transistors M9 and M10 are switched off because the clock signal $\overline{TS}$ jumps to a low voltage and the inverse clock signal TS jumps to a high voltage. Thus, there is no latch operation. The start signal VS is applied to the inverter 120, and the inverter 120 and the second clock inversion circuit 130 keep the same state as the start signal VS. Further, the first transistor M1 is switched on because the start signal VS jumps to a low voltage, such that the fifth transistors M5 is switched off and the sixth transistor M6 is switched on. Thus, the inverter 120 outputs the shift register signal VO having a low level through the activated sixth transistor M6.

During period t3, the third and fourth transistors M3 and M4 are switched off and the ninth and tenth transistors M9 and M10 are switched on because the clock signal $\overline{TS}$ jumps to a high voltage and the inverse clock signal TS jumps to a low voltage. Thus, the inverter 120 and the second clock inversion circuit 130 perform latch operation. Thus, the shift register signal VO of the inverter 120 keeps an original state in period t2. The seventh transistor M7 is switched on by the shift register signal VO from the inverter 120, such that the PMOS transistor M5 is still off. In addition, the sixth transistor M6 maintains on state because the shift register signal VO is low-level. Thus, the inverter 120 maintains output of a low level shift register signal VO through the activated sixth transistor M6.

During period t4, the third and fourth transistors M3 and M4 are switched on and the ninth and tenth transistors M9 and M10 are switched off because the clock signal $\overline{TS}$ jumps to a low voltage and the inverse clock signal TS jumps to a high voltage. Thus, there is no latch operation. The start signal VS is applied to the inverter 120. The inverter 120 and the second clock inversion circuit 130 keep the same state as the start signal VS. The sixth and first transistors M6 and M1 are switched off and the fifth transistor M5 is switched on because the start signal VS is high level. Thus, the inverter 120 stops output of a low-level shift register signal VO.

However, the shift register unit 100 outputs a low level shift register signal during period t2, and at the same time, the next-stage shift register unit (not shown) also outputs a low level shift register signal. Thus, the adjacent shift register units may cause a conflict of signal outputting due to the overlapping of the adjacent shift register signals. Therefore, the shift register is unstable. Accordingly, an LCD device using the shift register has impaired display quality because adjacent columns or rows may be scanned simultaneously.

What is needed, therefore, is a shift register which can overcome the above-described deficiencies. What is also needed is an LCD device including the shift register.

SUMMARY

In one preferred embodiment, a shift register for providing a plurality of low level shift register signals, the shift register includes a plurality of shift register units connecting in series, each shift register unit comprising a first inversion circuit, a second inversion circuit, and a third inversion circuit. The third inversion circuit for receiving a first clock signal from an external circuit, which has a first transistor for outputting the first clock signal, and a second transistor for outputting a turning off signal. The first inversion circuit for receiving output signal from a pre-stage shift register unit and a second clock signal which is inversed to the first clock signal, and output a control signal to the third inversion circuit, which includes a third transistor in an on state, discharging at an output end for keeping a stable output signal. The second inversion circuit receives the output signal from the first inversion circuit, and outputting a control signal to control the turn-of of turn-off of the second transistor. The first clock signal is output through the first transistor and the second transistor is switched off under the control of the second inversion circuit, when the first inversion circuit inputs a turn-on signal to switch on the first transistor; in verse, the first transistor is switched off and the second transistor is switched on under the control of the second inversion circuit.

Other novel features and advantages will become more apparent from the following detailed description when taken in conjunction with the accompanying drawings.

DETAILED DESCRIPTION OF PREFERRED EMBODIMENTS

Figure 1:
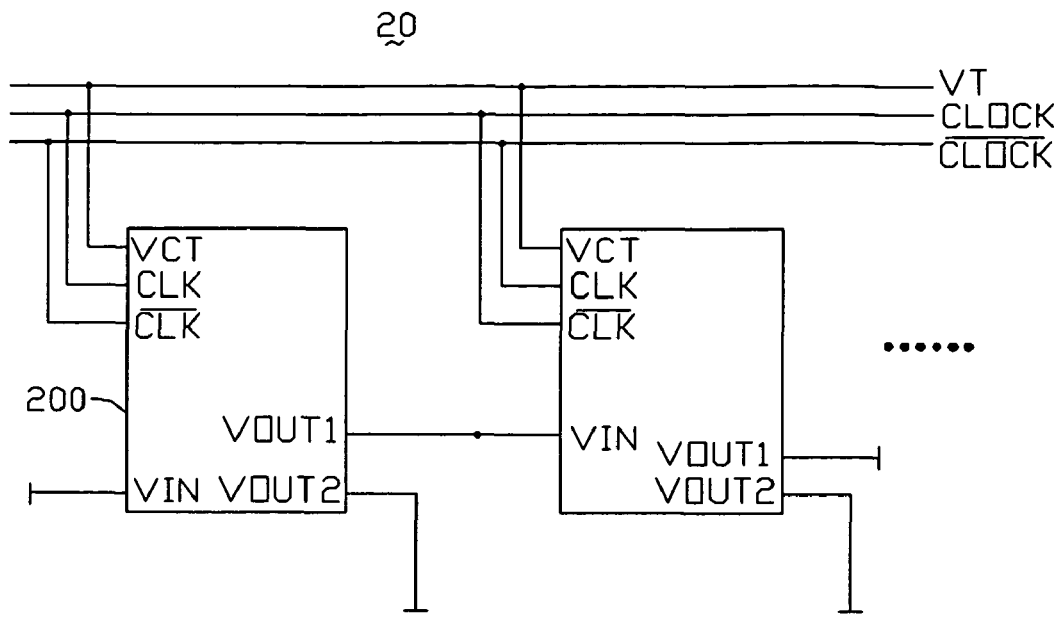
FIG. 1 is a block circuit diagram of a shift register according to an exemplary embodiment of the present invention, the shift register including a plurality of shift register units.

Referring to FIG. 1, a block circuit diagram of a shift register 20 according to an exemplary embodiment of the present invention is shown. The shift register 20 includes a plurality of shift register units 200 connected in series. The shift register units 200 have the same circuit structure. The shift register units 200 each include a clock signal input CLK, an inverse clock signal input $\overline{CLK}$, a signal input VIN, a first output VOUT1, a second output VOUT2 and a test signal input VCT. The clock signal input CLK of the pre-stage shift register 200 is connected to an external circuit to receive clock signals, and the inverse clock signal input $\overline{CLK}$ is connected to the external circuit to receive inversed clock signals, and the signal input VIN is used to receive input signals, and the first output VOUT1 is connected to the signal input VIN of a rear-stage shift register unit 200, and the second output VOUT2 is configured to output signals to an external circuit. The rear-stage 200 has a similar connections to that of the pre-stage shift register unit 200 except that the clock signal input CLK thereof is connected to the external circuit to receive the reversed clock signals, and the inverse clock signal input $\overline{CLK}$ is connected to the external circuit to receive clock signals. The two clock signals are denoted as CLOCK and $\overline{CLOCK}$, respectively, which are identical in amplitude, duty ratio, and frequency, and are inversed in phase. A duty ratio of the clock signals can be 50%. It should be noted that the clock signal input CLK of the pre-stage shift register unit 200 and the inverse clock signal input $\overline{CLK}$ of the rear-stage shift register unit 200 are applied with the same clock signal. The inverse clock signal input $\overline{CLK}$ of the pre-stage shift register unit 200 and the clock signal input CLK of the rear-stage shift register unit 200 are applied with the same clock signal.

Figure 2:
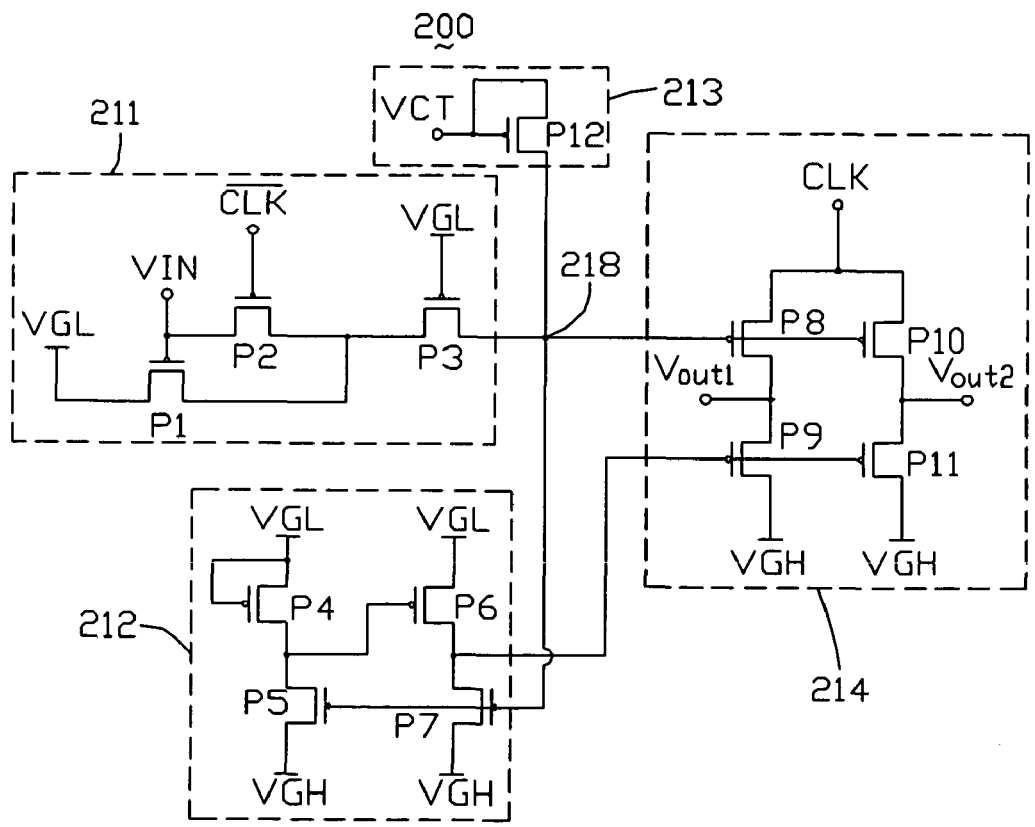
FIG. 2 is a circuit diagram of one of the shift register units of FIG. 1.

Referring also to FIG. 2, a circuit diagram of one of the shift register units of FIG. 1 is shown. The shift register unit 200 further includes a first inversion circuit 211, a second inversion circuit 212, a test signal input circuit 213, and a third inversion circuit 214. The first inversion circuit 211 includes a first transistor P1, a second transistor P2 and a third transistor P3. A drain of the first transistor P1 is connected to a low level voltage VGL (such as a grounding voltage), a gate of the first transistor P1 is connected to the signal input VIN thereof, a source of the first transistor P1 is connected to a drain of the second transistor P2. A source of the second transistor P2 is connected to the gate of the first transistor P1, a gate of the second transistor P2 is connected to the inverse clock signal input $\overline{CLK}$, a drain of the second transistor P2 is connected to a source of the third transistor P3. A gate of the third transistor P3 is applied with a low level voltage VGL, and a drain of the third transistor P3 is connected to a node 218.

The second inversion circuit 212 includes a fourth transistor P4, a fifth transistor P5, a sixth transistor P6, and a seventh transistor P7. A drain and a gate of the fourth transistor P4 are respectively applied with a low level voltage VGL (such as a grounding voltage), a source of the fourth transistor P4 is connected to a drain of the fifth transistor P5. A gate of the fifth transistor P5 is connected to the node 218, a source thereof is applied with a high level voltage VGH (such as a power source). A gate of the sixth transistor P6 is connected to the source of the fourth transistor p4, a drain thereof is connected to a low level voltage VGL, a source thereof is connected to the a drain of the seventh transistor P7. A gate of the seventh transistor P7 is also connected to the node 218, and a source thereof is applied with a high level voltage VGH.

The third inversion circuit 214 includes an eighth transistor P8, a ninth transistor P9, a tenth transistor P10, and an eleventh transistor P11. A drain of the eighth transistor P8 is the clock signal input of the shift register 200, a gate thereof is connected to the node 218, and a source thereof is defined as the first signal output VOUT1 of the shift register 200. A gate of the ninth transistor P9 is connected to the source of the sixth transistor P6, a drain thereof is connected to the source of the eighth transistor P8, and a source thereof is applied with a high level voltage VGH. A drain of the tenth transistor P10 is connected to the clock signal input CLK, a gate thereof is connected to the node 218, and a source thereof is defined as the second signal output VOUT2. A drain of the eleventh transistor P11 is connected to the source of the tenth transistor P10, a gate thereof is connected to the source of the sixth transistor P6, and a source thereof is applied with the high level voltage VGH.

The test signal input circuit 213 includes a twelfth transistor P12. A gate of the twelfth transistor P12 is defined as a test signal input VCT, a source thereof is connected to the gate thereof, and a drain is connected to the node 218.

Figure 3:
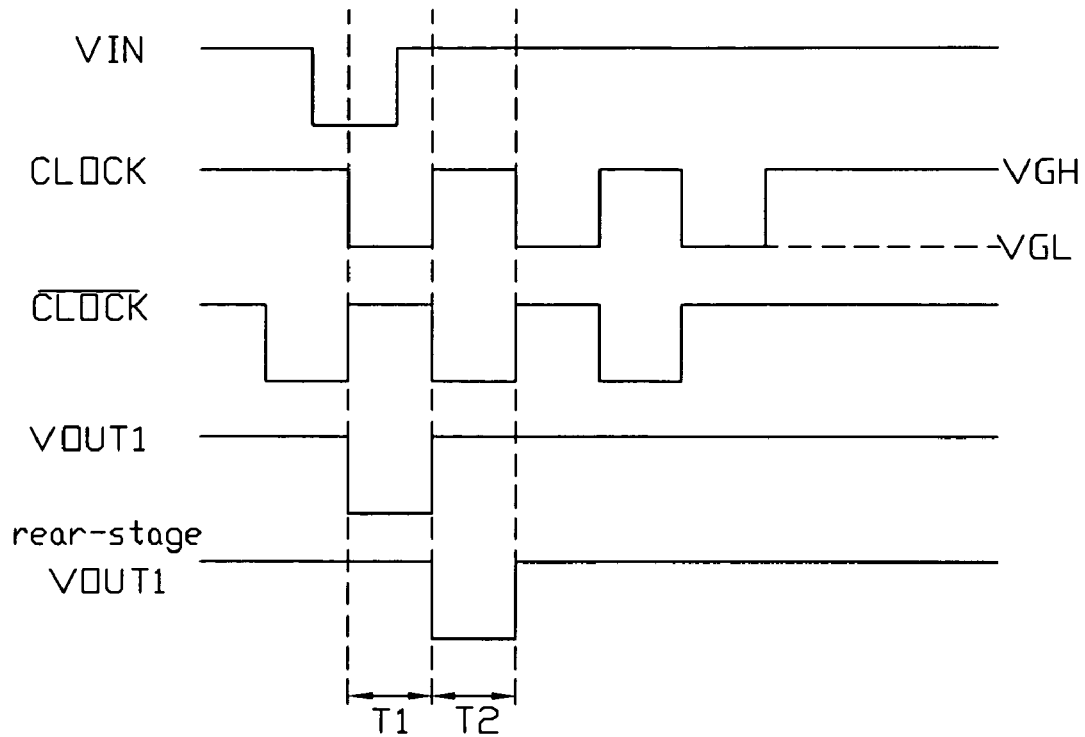
FIG. 3 is a sequence waveform diagram of pulse signals of the shift register of FIG. 1.

Referring also to FIG. 3, a sequence waveform diagram of pulse signals of the shift register 20 is shown. Assuming that the shift register 20 is switched on at the beginning of period T1, during period T1, the start signal VIN is changed to a high level from a low level. The clock signal CLOCK is at a low level, and the inverse clock signal $\overline{CLOCK}$ is at a high level. The first transistor P1 of the pre-stage shift register unit 200 is in an on state, and the second transistor P2 thereof is in an off state, and the third transistor P3 is in an on state all the time, same to a capacitor. The low level voltage VGL applied to the drain of the first transistor P1 is applied to the node 218 through the third transistor P3, and charges the third transistor P3. When the node 218 is floating, the third transistor P3 keeps the voltage of the node 218, which keeps a stable low level voltage output of the node 218. The low level voltage VGL is applied to the gates of the eighth transistor P8 and the tenth transistor P10 via the activated third transistor P3. The VGL serves as a control signal, which can turn on the gates of the eighth transistor P8 and the tenth transistor P10. Thus, the eighth transistor P8 and the tenth transistor P10 are switched on. The low level voltage CLK is applied to the first signal output VOUT1 via the activated eighth transistor P8, and is further applied to the second signal output VOUT2 via the activated tenth transistor P10. The first signal output VOUT1 outputs a low level voltage to the rear-stage shift register unit 200. The second signal output VOUT2 outputs a low level signal VGL to the external circuit. At the same time, the VGL further turns on the gates of the fifth transistor P5 and the seventh transistor P7. Thus, the fifth transistor P5 and the seventh transistor P7 are switched on. The high level voltage VGH is applied to the gates of the ninth transistor P9 and the eleventh transistor P11 via the activated seventh transistor P7. Thus, the ninth transistor P9 and the eleventh transistor P11 are switched off, which assure the output signals from the first and the second signal output VOUT1, VOUT2 from being affected by the high level voltage VGH applied to the drains of the ninth transistor P9 and the eleventh transistor P11.

During the period T1, the first input VIN of the rear-stage shift register 200 receives a low level voltage from the pre-stage shift register unit 200. The clock signal input CLK receives the reverse clock signal $\overline{CLOCK}$ from the external circuit which is high level voltage, and the reverse clock signal input $\overline{CLK}$ receives the clock signal CLOCK from the external circuit, which is low level voltage. Thus, the first transistor P1 and the second transistor P2 of the rear-stage shift register 200 is turned on, and the first inversion circuit 211 outputs the low level voltage VGL, and charges the third transistor P3, which assures a stable low level voltage output of the first inversion circuit 211. The low level voltage VGL from the first inversion circuit 211 of the rear-stage shift register unit 200 switches off the ninth transistor P9 and the tenth transistor P10 through the second inversion circuit 212. Thus, the first inversion circuit 211 outputs a synchronized high level voltage to the inverse clock signal $\overline{CLOCK}$.

During period T2, the rear-stage shift register 200 receives a high level voltage VGH from the first signal output VOUT1, the clock signal input CLK receives a low level clock, and the reverse clock signal input $\overline{CLK}$ receives a high level clock, which switches off the first and the second transistors P1, P2 of the rear-stage shift register 200. The third transistor P3 discharges, which assures a low level voltage output of the first inversion circuit 211. The low level voltage turns on the eighth and the tenth transistors P8, P10. Thus, the output signals from the first and the second signal outputs VOUT1, VOUT2 changes to a low level voltage from a high level voltage.

The test signal input circuit 213 keeps in an off state in a normal work mode, which does not affect the operation of the shift register 20, and starts when a liquid crystal panel is testing.

As state above, when the signal input VIN receives a low level voltage signal VGL, the eighth and the tenth transistors P8, P10 are switched on, the shift register unit 200 outputs the clock signal CLOCK applied to the sources of the eighth and the tenth transistors P8, P10, and provides the clock signal CLOCK to the rear-stage shift register unit 200. When the clock signal CLOCK is an effective voltage, the third transistor P3 is charged, which assures a stable low level voltage output of the first inversion circuit 211. Thus, the eighth and the tenth transistors P8, P10 of the rear-stage shift register unit 200 are turned on, the rear-stage shift register unit 200 outputs the reverse clock signal $\overline{CLOCK}$ applied to the sources of the eighth and the tenth transistors P8, P10. Because the waveform of the clock signal CLOCK and the reverse clock signal $\overline{CLOCK}$ is reverse, the output waveforms of the pre-stage and the rear-stage shift register units 200 don't have any overlapping.

Figure 4:
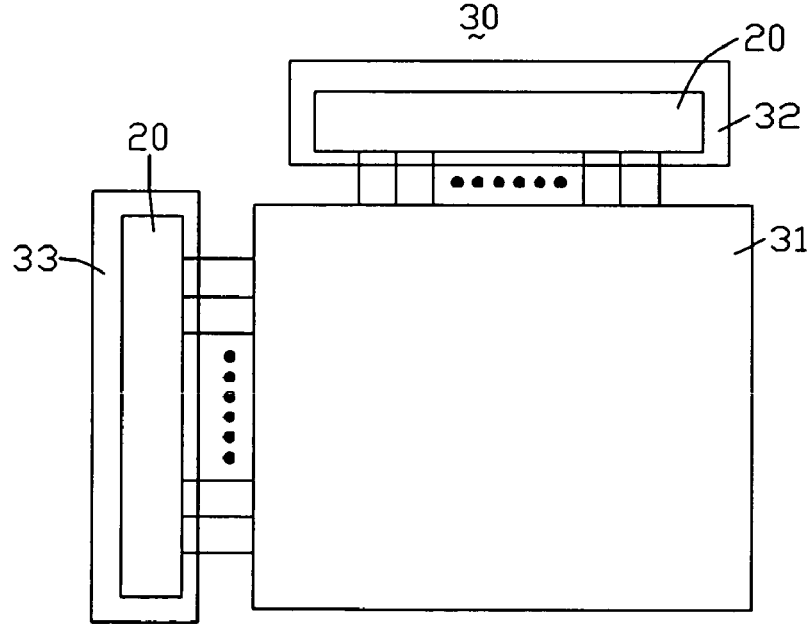
FIG. 4 is a block circuit diagram of an LCD device including the shift register of FIG. 1.
Figure 5:
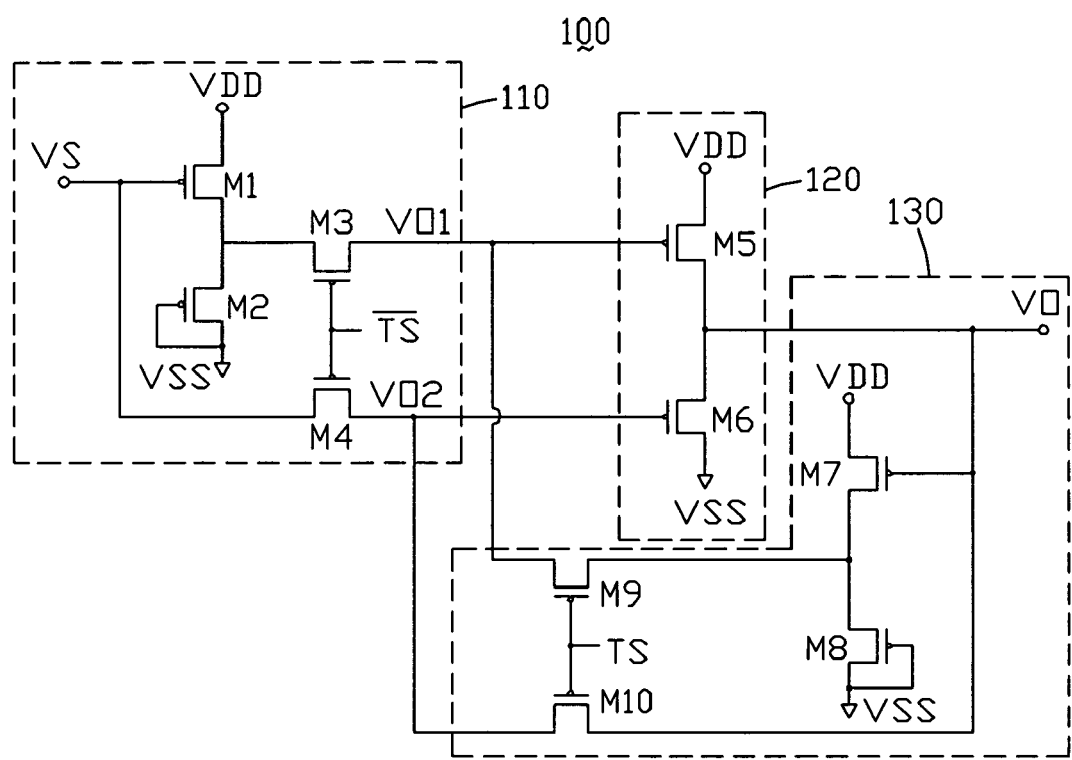
FIG. 5 is a circuit diagram of a shift register unit of a conventional shift register.
Figure 6:
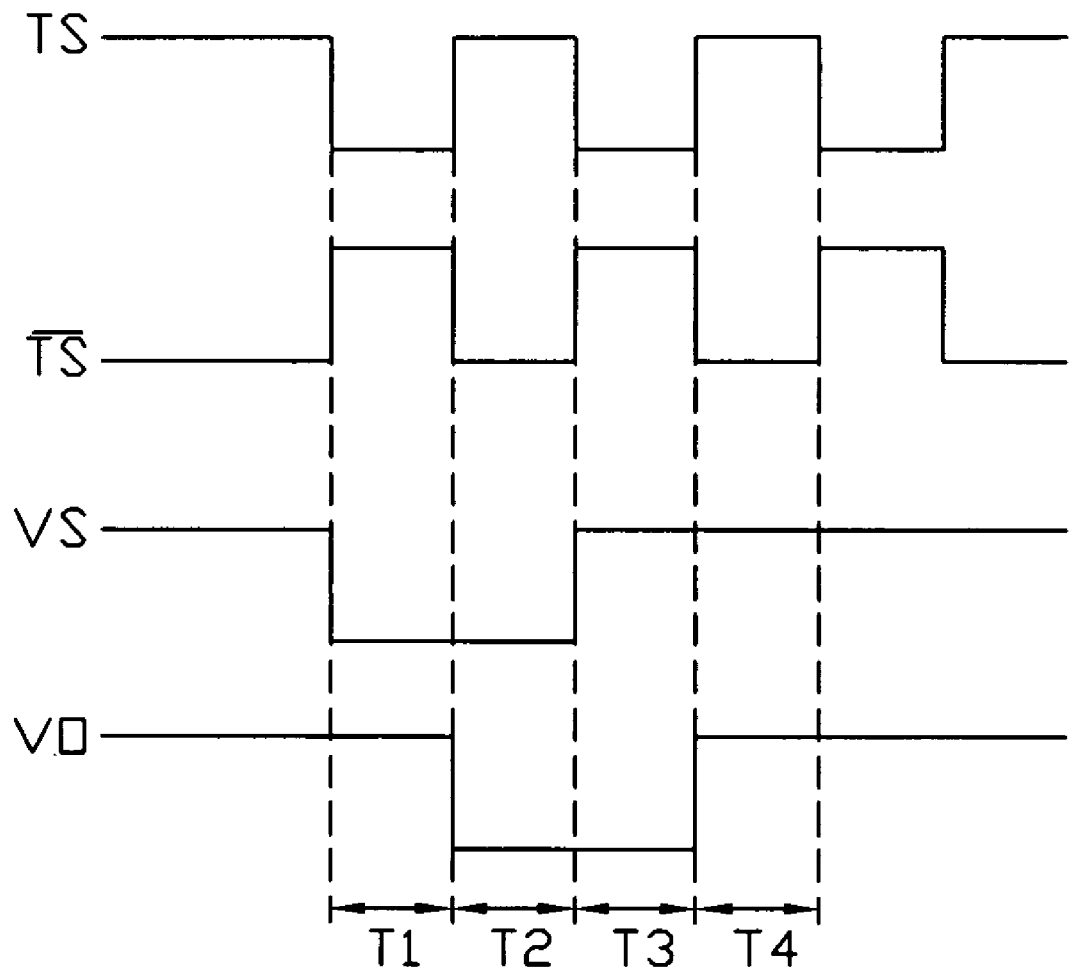
FIG. 6 is a sequence waveform diagram of pulse signals of the shift register of FIG. 5.

Referring to FIG. 4, a liquid crystal display 30 according to an exemplary embodiment of the present invention is shown. The liquid crystal display 30 includes a liquid crystal panel 31, a gate driving circuit 33, and a data driving circuit 32. The data driving circuit 32 and the gate driving circuit 33 each include at least one shift register 20. The shift register 20 provides a plurality of shift register signals sequentially to the liquid crystal panel 31.

It is to be further understood that even though numerous characteristics and advantages of the present embodiments have been set out in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shift register for providing a plurality of low level shift register signals, the shift register comprising a plurality of shift register units connecting in series, each shift register unit comprising a first inversion circuit, a second inversion circuit, and a third inversion circuit;

the third inversion circuit receiving a first clock signal from an external circuit, and comprising a first transistor for outputting the first clock signal, and a second transistor for outputting an turning off signal;

the first inversion circuit comprising a third transistor in an on state for discharging at an output end for keeping a stable output signal, a fourth transistor and a fifth transistor, a drain of the fifth transistor receiving a low level voltage from the external circuit, a gate of the fifth transistor and a source of the fourth transistor receiving the output signal from a pre-stage shift register unit, a source of the fifth transistor connected to a drain of the fourth transistor, a gate of the fourth transistor receiving a second clock signal having a phase inversed to a phase of the first clock signal, a gate of the third transistor receiving the low level voltage, a drain of the third transistor connected to the source of the fifth transistor, and the first inversion circuit outputting an output signal to the third inversion circuit and the second inversion circuit via a source of the third transistor;

the second inversion circuit receiving the output signal from the first inversion circuit, and outputting a control signal to control the turn-on and turn-off of the second transistor;

wherein when the output signal of the first inversion circuit is a turn on signal to switch on the first transistor, the first clock signal is output through the first transistor and the second transistor is switched off under the control of the second inversion circuit, when the output signal of the first inversion circuit is a turn off signal to switch off the first transistor, the second transistor is switched on under the control of the second inversion circuit.

2. The shift register in claim 1, wherein the second inversion circuit comprises a sixth transistor, a seventh transistor, an eighth transistor, and a ninth transistor, a drain and a gate of the sixth transistor being respectively applied with a low level voltage, a source of the sixth transistor being connected to a drain of the seventh transistor, a gate of the seventh transistor being connected to a node, a source thereof being applied with a high level voltage, a gate of the eighth transistor being connected to the source of the sixth transistor, a drain of the eighth transistor being connected to a low level voltage, a source of the eighth transistor being connected to the a drain of the ninth transistor, a gate of the ninth transistor being also connected to the node, and a source of the ninth transistor being applied with a high level voltage.

3. The shift register in claim 1, wherein the shift register unit further comprises a test signal input circuit.

4. The shift register in claim 3, wherein the test signal input circuit comprises a tenth transistor, a gate of the tenth transistor being defined as a test signal input, a source of the tenth transistor being connected to the gate thereof, and a drain of the tenth transistor being connected to the source of the third transistor.

5. A liquid crystal display, comprising:
a liquid crystal panel;
a data driving circuit having a shift register; and
a scanning driving circuit having a shift register;
each shift register comprising a plurality of shift register units connecting in series, each shift register unit comprising a first inversion circuit, a second inversion circuit, and a third inversion circuit;
the third inversion circuit receiving a first clock signal from an external circuit, and comprising a first transistor for outputting the first clock signal, and a second transistor for outputting an turning off signal;

the first inversion circuit comprising a third transistor in an on state for discharging at an output end for keeping a stable output signal, a fourth transistor and a fifth transistor, a drain of the fifth transistor receiving a low level voltage from the external circuit, a gate of the fifth transistor and a source of the fourth transistor receiving the output signal from a pre-stage shift register unit, a source of the fifth transistor connected to a drain of the fourth transistor, a gate of the fourth transistor receiving a second clock signal having a phase inversed to a phase of the first clock signal, a gate of the third transistor receiving the low level voltage, a drain of the third transistor connected to the source of the fifth transistor, and the first inversion circuit outputting an output signal to the third inversion circuit and the second inversion circuit via a source of the third transistor;

the second inversion circuit receiving the output signal from the first inversion circuit, and outputting a control signal to control the turn-on and turn-off of the second transistor;

wherein when the output signal of the first inversion circuit is a turn on signal to switch on the first transistor, the first clock signal is output through the first transistor and the second transistor is switched off under the control of the second inversion circuit, when the output signal of the first inversion circuit is a turn off signal to switch off the first transistor, the second transistor is switched on under the control of the second inversion circuit.

6. The liquid crystal display in claim 5, wherein the second inversion circuit comprises a sixth transistor, a seventh transistor, an eighth transistor, and a ninth transistor, a drain and a gate of the sixth transistor being respectively applied with a low level voltage, a source of the sixth transistor being connected to a drain of the seventh transistor, a gate of the seventh transistor being connected to a node, a source thereof being applied with a high level voltage, a gate of the eighth transistor being connected to the source of the sixth transistor, a drain of the eighth transistor being connected to a low level voltage, a source of the eighth transistor being connected to the a drain of the ninth transistor, a gate of the ninth transistor being also connected to the node, and a source of the ninth transistor being applied with a high level voltage.

7. The liquid crystal display in claim 5, wherein the shift register unit further comprises a test signal input circuit.

8. The liquid crystal display in claim 7, wherein the test signal input circuit comprises a tenth transistor, a gate of the tenth transistor being defined as a test signal input, a source of the tenth transistor being connected to the gate thereof, and a drain of the tenth transistor being connected to the source of the third transistor.

* * * * *